United States Patent [19]

Nelson et al.

[11] Patent Number: 4,882,654
[45] Date of Patent: Nov. 21, 1989

[54] METHOD AND APPARATUS FOR ADJUSTABLY MOUNTING A HEAT EXCHANGER FOR AN ELECTRONIC COMPONENT

[75] Inventors: Richard D. Nelson, Austin, Tex.; Omkarnath R. Gupta, Englewood, Colo.; Dennis J. Herrell, Austin, Tex.

[73] Assignee: Microelectronics and Computer Technology Corporation, Austin, Tex.

[21] Appl. No.: 288,363

[22] Filed: Dec. 22, 1988

[51] Int. Cl.$^4$ .......................................... H01L 23/34
[52] U.S. Cl. .................................... 361/382; 361/386
[58] Field of Search ............... 361/381, 382, 383, 384, 361/385, 386, 387, 388

[56] References Cited

U.S. PATENT DOCUMENTS

| | | | |
|---|---|---|---|
| 4,072,188 | 2/1978 | Wilson et al. | 165/80 |
| 4,263,965 | 4/1981 | Mansuria et al. | 165/80 |
| 4,448,240 | 5/1984 | Sharon | 165/80 |
| 4,462,462 | 7/1984 | Meagher et al. | 361/386 |
| 4,498,530 | 2/1985 | Lipschutz | 165/185 |
| 4,535,841 | 8/1985 | Kok | 165/185 |
| 4,558,395 | 12/1985 | Yamada et al. | 361/385 |
| 4,631,636 | 12/1986 | Andrews | 361/385 |
| 4,693,303 | 9/1987 | Okada | 165/80.4 |
| 4,791,983 | 12/1988 | Nicol et al. | 361/385 |

FOREIGN PATENT DOCUMENTS 85400097.3 1/1985 European Pat. Off. .
85400098.1 1/1985 European Pat. Off. .

*Primary Examiner*—Roy N. Envall, Jr.
*Attorney, Agent, or Firm*—Fulbright & Jaworski

[57] ABSTRACT

A fluid heat exchanger for mating with an electronic component is supported from a fixed support. A connection between the fixed support and the heat exchanger is initially flexible for adjusting the position of the heat exchanger to accommodate variations in the height or attitude of the electronic component for providing a good thermal interface. Thereafter, the connection changes to a rigid connection to provide good structural suppport for the heat exchanger which allows the support to withstand vibration or shock without overloading the electronic component. The flexibility of the connection may be reversible for later readjusting the position of the heat exchanger relative to the electronic component.

13 Claims, 3 Drawing Sheets

METHOD AND APPARATUS FOR ADJUSTABLY MOUNTING A HEAT EXCHANGER FOR AN ELECTRONIC COMPONENT

BACKGROUND OF THE INVENTION

It is important to provide a support structure for heat exchangers in an electronic package which can adjust to variations in the height or attitude of electronic components such as a chip, but which is structurally secured. This is a particularly important problem in multi-chip packages where individual heat exchangers and chips may be non-coplanar by as much as 0.5 mm. However, even in such cases, the heat exchanger must be closely mated to the electronic component in order to provide a good thermal interface.

One solution to this problem is to provide a very compliant mounting of the heat exchangers or the electronic components, or both. However, in service, the package may have to withstand vibration or shock which generally requires a non-compliant, structurally secure mounting of the heat exchanger to avoid overloading a delicate electronic component, such as a chip and its connections. But, during service, some compliance should be provided for in the package in order to maintain the thermal contact with the heat exchanger when minor package warpage occurs.

The present invention provides an apparatus and method for adjustably supporting a heat exchanger during assembly for closely mating with an electronic component by being adjustable to variations in the height or attitude of the electronic component, and thereafter securely supporting the heat exchanger to avoid overloading the electronic component during service.

SUMMARY

The present invention is directed to a method and apparatus for adjustably mounting a heat exchanger for mating with an electronic component and generally includes a fluid heat exchanger having a fluid inlet and outlet. A fixed support is provided for supporting the heat exchanger. Connecting means are provided between the fixed support and the heat exchanger in which the connecting means initially is flexible for adjusting the position of the heat exchanger relative to the electronic component for providing a good thermal interface, and thereafter the connecting means is rigid for fixedly holding and supporting the heat exchanger from the fixed support.

A still further object of the present invention is wherein the connecting means initially allows movement of the heat exchanger relative to the fixed support. Preferably, the relative movement is both rotational and longitudinally slidable to provide a good thermal interface between the heat exchanger and the electronic component.

Yet a still further object of the present invention is wherein the rigidity of the connecting means is reversible so that the interface can be adjusted during the service life of the package.

Yet a still further object of the invention is wherein the connecting means is selected from a group consisting of wax, solder, epoxy resin and ultraviolet activated resin.

Still a further object of the present invention is wherein means are provided for urging the heat exchanger into a closely mating engagement with the electronic component. Such means may include spring means, weight, or fluid actuated means.

Still a further object of the present invention is wherein the fixed support may include fluid passageways in communication with the fluid inlet and fluid outlet of the heat exchanger.

Yet a still further object of the present invention is the provision of a substrate connected to the electronic component by compliant connections which will allow the electronic component to maintain good thermal contact with the heat exchanger when minor physical changes occur in the package, such as warpage.

Still a further object of the present invention is the provision of a method of adjustably mounting a fluid heat exchanger into a mating contact with an electronic component by attaching a fluid heat exchanger to a fixed support through a flexible connection, adjusting the heat exchanger relative to the fixed support and the electronic component for placing the heat exchanger into a good thermal contact with the electronic component by compensating in variations in the height or attitude of the electronic component, and changing the flexible connection to a rigid connection for supporting the heat exchanger from the fixed support for avoiding overloading the electronic component. Preferably, the flexible connection is changed to a rigid connection by varying the temperature of the connection. Preferably, the change in the rigidity of the connection is reversible.

Other and further objects, features and advantages will be apparent from the following description of presently preferred embodiments of the invention, given for the purpose of disclosure, and taken in conjunction with the accompanying drawings.

BRIEF DESCRIPTION OF THE PREFERRED EMBODIMENTS

Figure 1:
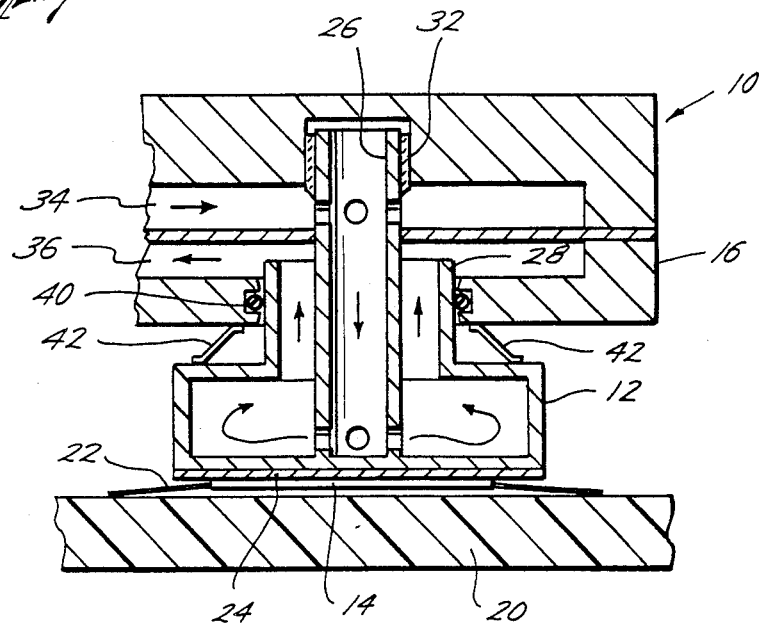
FIG. 1 is an elevational view, in cross section, illustrating one embodiment of the present invention.
Figure 2:
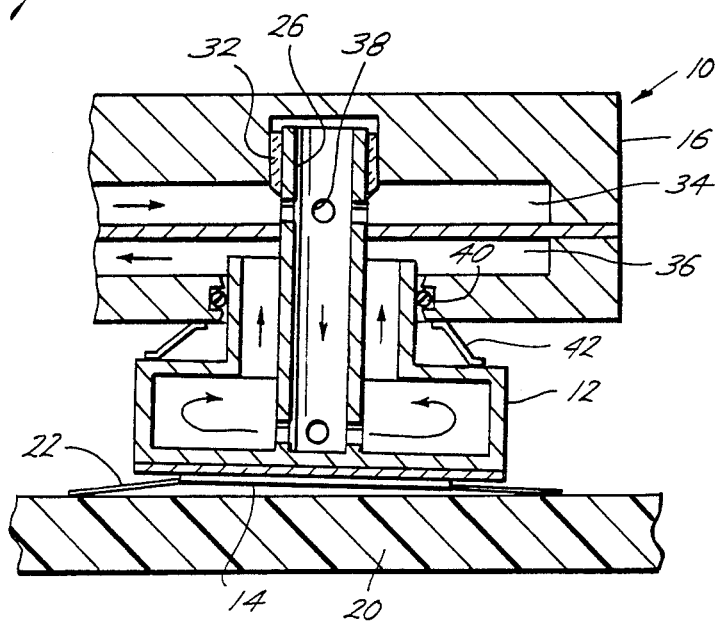
FIG. 2 is a view similar to that of FIG. 1 illustrating the ability of the present invention to compensate for variations in the position of an electronic component.

Referring now to the drawings, and particularly to FIGS. 1 and 2, the reference numeral 10 generally indicates the apparatus of the present invention and generally includes a fluid heat exchanger 12 adapted to be adjustably mounted for thermally mating with an electronic component 14, such as a chip, and a fixed support 16.

The electronic component or chip 14 is electrically connected to a substrate 20 preferably through a plurality of compliant connections 22, which may be tape automated bonding (TAB) beams, solder bumps, or wire bonds. It is particularly important that the heat exchanger 12 be closely mated to the electronic component 14 for providing a good thermal interface 24 which may be established and maintained by any suitable methods such as solder attachment, grease, clamping, self-clamping, or a microcapillary attachment. However, the chip 14, as best seen in FIG. 2, may be positioned at various heights or attitudes on the substrate 20. The apparatus 10 of the present invention provides a support structure which can be adjusted to compensate for variations in the height or attitude of the chip 14. However, later in service, the structure 10 may have to withstand vibration or shock. Therefore, the present invention provides a support structure which can securely hold the heat exchanger 12 for avoiding overloading the delicate chip 14 and its connections 22.

The embodiment of FIGS. 1 and 2 discloses a heat exchanger 12 having a fluid inlet, either liquid or gas, and a fluid outlet, which include an inlet 26 and an outlet 28, which in this embodiment are concentric tubes with the tube 26 including openings 38 for transmitting incoming fluids from the inlet 26 to the body of the heat exchanger 12 and to the outlet 28.

The inlet and outlet tubes 26 and 28 are movable relative to the fixed support 16 so that the heat exchanger 12 can be rotated or longitudinally moved relative to the fixed support 16 for being adjustable to compensate for variations in the height or attitude of the surface of the chip 14.

Connecting means 32 is provided between the fixed support 16 and the heat exchanger 12, such as between the inlet tube 26 and the support 16. The connecting means 32 is initially flexible for allowing for the adjustment of the position of the heat exchanger 12 relative to the electronic component or chip 14 for providing the desired thermal interface. Thereafter, the connecting means 32 becomes rigid for allowing the fixed support 16 to structurally secure and support the heat exchanger 12 for avoiding over loading the chip 14 in the event of external vibration or shock to the apparatus 10. The connecting means may be of various types of material which in the initial phase are flexible but which in a subsequent phase become rigid. For example, the connecting means 32 may be wax, solder, epoxy resin, ultraviolet light activated resin or other similar two-phase materials. For example, a wax or solder may be used which under higher temperatures becomes soft and mallable and will allow the heat exchanger 12 to be adjusted to mate with the chip 14. Thereafter, the wax or solder may be cooled to provide a rigid and securely supporting structure.

In the embodiment shown in FIGS. 1 and 2, the fixed support 16 may include a fluid manifold having an inlet fluid passageway 34 and an outward fluid passageway 36. The inward fluid passageway 34 is in communication with the inlet tube 26 through openings 38 and the outlet fluid passageway 36 is in communication with the outlet tubular member 28. It is noted that seal means, such as an O-ring 40, may be provided between the fixed support 16 and the outlet tube 28 for preventing leakage. This particular structure is advantageous in changing the state of the connecting means 32 from being flexible to rigid. That is, in the example of using a wax or solder, hot water may be flowed through the inlet passageway 34, heating up the connecting means 32 to a flexible state for allowing adjustment of the heat exchanger 12 relative to the chip 14. After the adjustment is completed, the connecting means 32 may be cooled or allowed to cool to change to a rigid connection.

Preferably, the rigidity of the connecting means 32 is reversible such as in the case of wax or solder. That is, after the apparatus 10 has been in use, changes may occur due to aging which could cause an excessive strain on the interface between the heat exchanger 12 and the chip 14 or could lessen the amount of the interface. In this case, the connecting means 32 could be reheated, the heat exchanger 12 could then be readjusted to provide a better thermal interface, and the connecting means 32 could again be changed to a rigid connection.

It is also desirable to provide for some means for urging the heat exchanger 12 into a closely mating engagement with the chip 14. For example, springs 42 may be provided between the heat exchanger 12 and the fixed support 16. In some cases, the weight of the heat exchanger 12 may be sufficient or the force of the fluid flowing through the inlet passageway 34 may be sufficient to urge the heat exchanger 12 into a good mating relationship with the chip 14 during the adjustment process.

While it is noted that the connecting means 32 is shown in the embodiment of FIGS. 1 and 2 between the fixed support 16 and the inlet tube 26, the connecting means 32 may be provided at other locations for allowing for adjustment of the position of the heat exchanger 12. For example, the connecting means 32 may be connected between the fixed support 16 and the outer tube 28 or the inlet tubes 26 and 28 could be fixedly secured to the support 16 while movable relative to the heat exchanger 12 and the connecting means 32 could be provided between the tubes and the body of the heat exchanger 12.

It is also advantageous to use the present apparatus 10 with an electronic component 14 which has a compliant connection with the substrate 20 such as by the connections 22. That is, if the heat exchanger is rigidly secured to the fixed support 16, the compliance in the connections 22, such as by TAB beams, solder bumps or wire bonds, provides a sufficient compliance to allow the chip 14 to maintain good thermal contact with the heat exchanger 12 when minor structural changes occur such as minor package warpage. Additional minor compliance can be provided by an interface 24 which may be flexible in one or more directions such as the compliance provided for by a grease interface.

Other and further embodiments may be provided and will be desribed hereinafter wherein like parts to those shown in FIGS. 1 and 2 are similarly numbered with the addition of the suffix "a" and "b".

Figure 3:
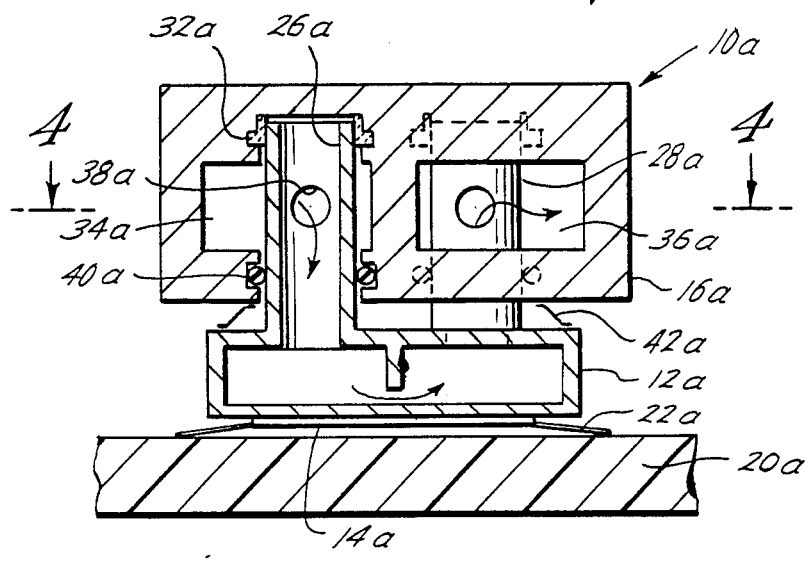
FIG. 3 is an elevational view, in cross section, illustrating another embodiment of the present invention and taken along line 3—3 of FIG. 4.
Figure 4:
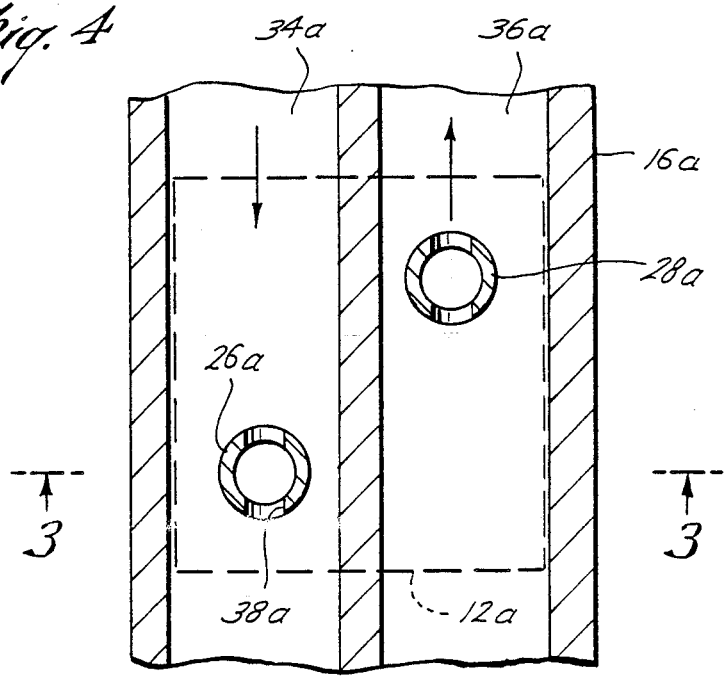
FIG. 4 is a cross-sectional view, taken along the line 4—4, of FIG. 3.

Referring now to FIGS. 3 and 4, a second embodiment is shown having non-concentric inlet tubes 26a and 28a, each of which is supplied with an O-ring seal 40a, and each of which includes connecting means 32a which is changeable between a flexible state and a rigid state.

Figure 6:
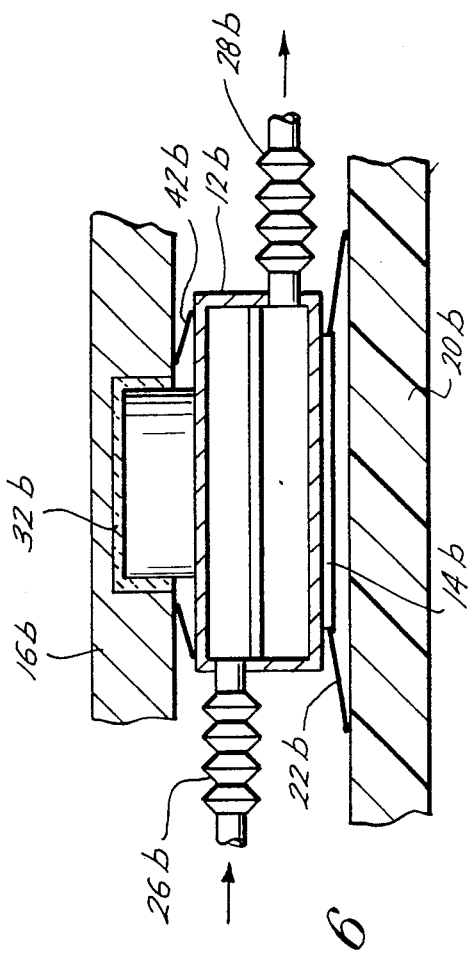
FIG. 6 is an elevational view, in cross section, of a further embodimennt of the present invention.

Referring now to FIG. 6, another embodiment is shown in which the heat exchanger 12b is supported from a fixed structure 16b by connecting means 32b. In this case, the fluid inlet 16b and the fluid outlet 28b to the heat exchanger 12b is provided for by compliant tubes instead of a fluid manifold in the fixed support 16b.

Figure 5:
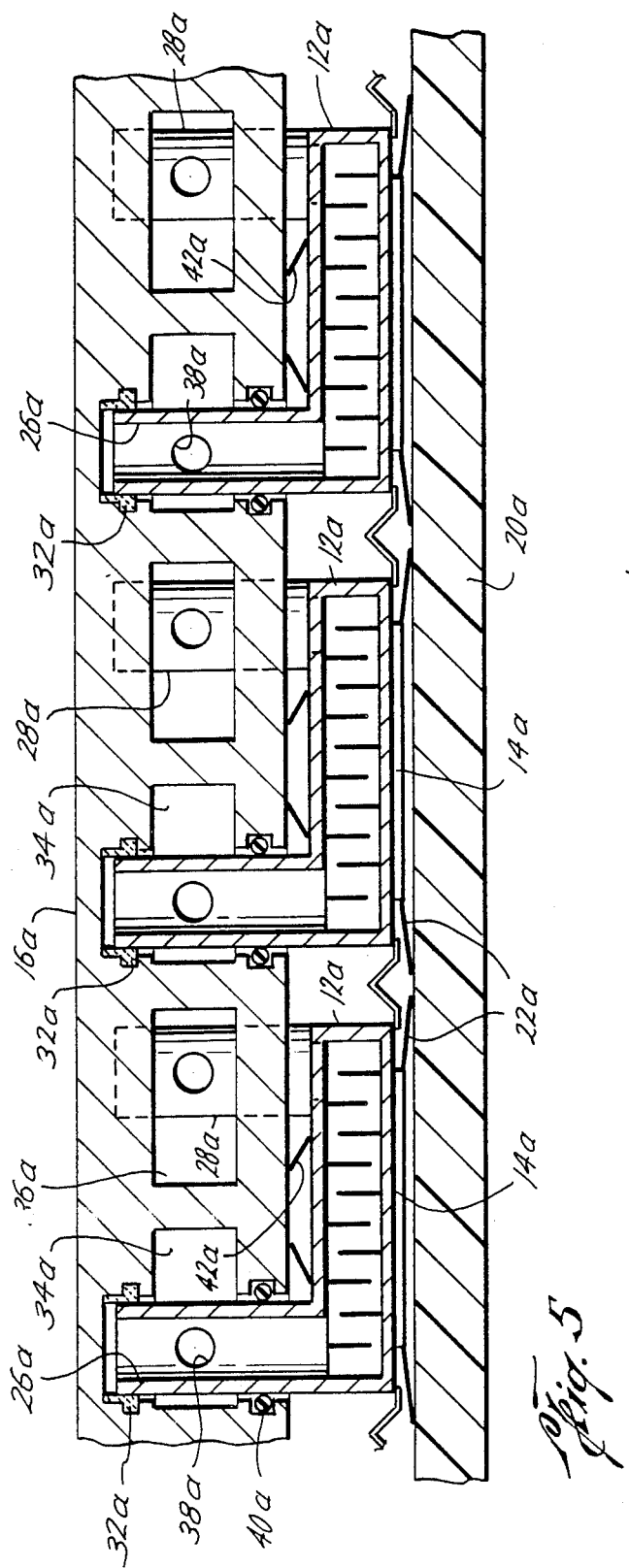
FIG. 5 is an elevational view, in cross section, of a plurality of heat exchangers in a multi-chip electronic package.

Referring now to FIG. 5, the embodiment of FIGS. 3 and 5 are shown in a multi-chip package. The present invention is particularly advantageous in multi-chip packages where the chips 14a may be non-coplanar relative to each other. However, since the heat exchangers 12a, all of which may be connected to the fixed support 16a, are individually adjustable, they can be adjusted to the variations in the height and attitude of their coacting chips 14a.

The method of the present invention is apparent from the forgoing description of the apparatus of the present invention and is generally directed to a method of adjustably mounting a fluid heat exchanger into a mating contact with an electronic component and includes attaching a fluid heat exchanger to a fixed support through a flexible connection, and adjusting the heat exchanger relative to the fixed support and the electronic component for placing the heat exchanger in a mating contact with the electronic component for compensating for variations in the height or attitude of the electronic component. The method further includes changing the flexible connection to a rigid connection for supporting the heat exchanger from the fixed support for avoiding overloading the electronic component. The method further includes wherein the flexible connection is changed to a rigid connection by varying the temperature of the connection. The method also includes changing the rigid connection to a flexible connection and readjusting the heat exchanger relative to the fixed support and the electronic component and again changing the flexible connection to a rigid connection.

The present invention, therefore, is well adapted to carry out the objects and attain the ends and advantages mentioned as well as others inherent therein. While exemplary embodiments of the invention are given for the purpose of disclosure, numerous changes in the details of construction, arrangement of parts, and steps of the method may be made which will readily suggest themselves to those skilled in the art and which are encompassed within the spirit of the invention and the scope of the appended claims.

What is claimed is:

1. An adjustably mounted heat exchanger for mating with an electronic component comprising,
   a fluid heat exchanger for mating with an electronic component, said heat exchanger having a fluid inlet and fluid outlet,
   a fixed support,
   connecting support means between the fixed support and the heat exchanger for supporting the fluid heat exchanger from the fixed support, said connecting support means initially being flexible for adjusting the position of the heat exchanger relative to the electronic component and thereafter being rigid for fixedly supporting the heat exchanger.

2. The apparatus of claim 1 wherein the connecting means initially allows movement of the heat exchanger relative to the fixed support.

3. The apparatus of claim 2 wherein the relative movement is rotational and longitudinally slidable.

4. The apparatus of claim 1 wherein the rigidity of the connecting means is reversible.

5. The apparatus of claim 1 wherein the connecting means are selected from a group consisting of wax, solder, epoxy resin and ultraviolet activated resin.

6. The apparatus of claim 1 including,
   means for urging the heat exchanger into a closely mating engagement with the electronic component.

7. The apparatus of claim 6 wherein said means for providing a closely mating engagement includes spring means between the heat exchanger and the fixed support.

8. The apparatus of claim 1 wherein the fixed support includes fluid passageways in communication with the fluid inlet and fluid outlet of the heat exchanger.

9. The apparatus of claim 1 including,
   a substrate connected to the electronic component by a compliant connection.

10. The method of adjustably mounting a fluid heat exchanger into a mating contact with an electronic component comprising,
    attaching a fluid heat exchanger to a fixed support through a flexible connection,
    adjusting the heat exchanger relative to the fixed support and the electronic component for placing the heat exchanger in a mating contact with the electronic component for compensating for variations in the height or attitude of the electronic component, and
    changing the flexible connection to a rigid connection for supporting the heat exchanger from the fixed support for avoiding overloading the electronic component.

11. The method of claim 10 wherein the flexible connection changes to a rigid connection by varying the temperature of the connection.

12. The method of claim 10 includes,
    again changing the rigid connection to a flexible connection,
    readjusting the heat exchanger relative to the fixed support and the electronic component, and
    again changing the flexible connection to a rigid connection.

13. The method of claim 12 including,
    changing the flexibility and rigidness of the connection by varying the temperature of the connection.

* * * * *